United States Patent [19]

Maxwell et al.

[11] Patent Number: 5,786,023
[45] Date of Patent: Jul. 28, 1998

[54] METHOD AND APPARATUS FOR THE FREEFORM GROWTH OF THREE-DIMENSIONAL STRUCTURES USING PRESSURIZED PRECURSOR FLOWS AND GROWTH RATE CONTROL

[76] Inventors: James L. Maxwell, 26500 Shiloh Way, Tallahassee, Fla. 32308; Joseph Pegna, 26 Meadow Valley Dr., Clifton Park, N.Y. 12065-2026

[21] Appl. No.: 600,454

[22] Filed: Feb. 13, 1996

[51] Int. Cl.$^6$ ............... C23C 8/00; B05D 3/12; C04B 40/00

[52] U.S. Cl. ............ 427/8; 427/586; 427/596; 427/595; 427/184; 427/196; 427/197; 427/201; 427/202; 427/248.1; 427/598; 427/264; 427/265; 427/255.1; 264/406; 264/412; 264/437; 264/446; 264/454; 264/40.1; 264/40.7; 264/82

[58] Field of Search ............ 427/8, 9, 10, 457, 427/458, 466, 470, 472, 474, 557, 586, 587, 596, 595, 597, 598, 599, 581, 521, 184, 196, 197, 201, 202, 226, 248.1, 255.1, 255.2, 264, 265; 264/401, 405, 406, 412, 437, 446, 454, 40.1, 40.7, 82

[56] References Cited

U.S. PATENT DOCUMENTS

| | | | |
|---|---|---|---|
| 4,200,669 | 4/1980 | Schaefer et al. | 427/596 |
| 4,234,624 | 11/1980 | Linderoth et al. | 427/521 |
| 4,358,471 | 11/1982 | Derkacs et al. | 427/10 |
| 4,637,938 | 1/1987 | Lee et al. | 427/596 |
| 4,859,277 | 8/1989 | Barna et al. | 427/8 |
| 5,057,781 | 10/1991 | Atkins et al. | 427/10 |
| 5,147,498 | 9/1992 | Nashimoto et al. | 156/627 |
| 5,156,697 | 10/1992 | Bourell et al. | |
| 5,169,579 | 12/1992 | Marcus et al. | |
| 5,175,017 | 12/1992 | Kobayshi et al. | 427/8 |
| 5,182,170 | 1/1993 | Marcus et al. | |
| 5,204,055 | 4/1993 | Sachs et al. | |
| 5,296,062 | 3/1994 | Bourell et al. | |
| 5,306,447 | 4/1994 | Marcus et al. | |
| 5,380,553 | 1/1995 | Loboda | 427/126.2 |
| 5,382,308 | 1/1995 | Bourell et al. | |

(List continued on next page.)

OTHER PUBLICATIONS

F.A. Houle, et al., "Laser Chemical Vapor Deposition of Copper," Appl. Phys. Lett., V. 46, No. 2, (15 Jan. 1985), pp. 204–206.

(List continued on next page.)

*Primary Examiner*—Marianne Padgett
*Attorney, Agent, or Firm*—Diane E. Smith

[57] ABSTRACT

Method and apparatus for the selective heat-induced deposition of solid material from gas-phase or super-critical fluids to produce three-dimensional parts by pyrolysis of the fluids. The apparatus involves computer/feedback control of the evolving shape by direct monitoring of the volumetric deposition rate or growth profile, and modifying light beam focal properties, the position and orientation of the deposit relative to the beam foci, and/or the pressure and flow of reactants to the growth zone. The precursor gases may be pressurized and heated to the critical point or beyond, becoming super-critical fluids, without condensation. Growth occurs by diffusion of reactants to the growth zone through a boundary layer over the deposit. One method of growth includes directing a large-area impinging jet of precursor fluid(s) onto a deposit interface, while limiting the reaction zone to a smaller area determined solely by size of the heated zone (through use of a radiant beam, e.g.). Another method comprises directing a small-area impinging jet of precursor fluid onto a deposit interface, where the heated region is larger than the jet size. Inclusion of a powder admixture and a precursor as a reactant, flowed jointly at high-pressures, create a two-phase flow, facilitated by increased viscosity of precursor fluid at high pressures. The powder may also be flowed separately, and adds volume and properties to the deposit material. Thus, the invention allows continuous growth of single- or multi-material, three-dimensional microstructures with internal features and characteristic dimensions from microns to decimeters.

25 Claims, 9 Drawing Sheets

U.S. PATENT DOCUMENTS

| | | |
|---|---|---|
| 5,387,380 | 2/1995 | Cima et al. |
| 5,387,442 | 2/1995 | Kroeger et al. ............................ 427/521 |
| 5,389,196 | 2/1995 | Bloomstein et al. |
| 5,431,965 | 7/1995 | Hocking et al. ............................ 427/587 |
| 5,460,758 | 10/1995 | Langer et al. ............................ 427/555 |
| 5,534,311 | 7/1996 | Shaw et al. ............................ 427/563 |

OTHER PUBLICATIONS

T.H. Baum, et al., "Laser-Induced Chemical Vapor Deposition of Aluminum," Appl. Phys. Lett., V. 55, No. 12 (18 Sep. 1989), pp. 1264–1266.

W.C. Natzle, "Distinguishing Laser Induced Thermal and Photochemical Surface Reactions By Photodeposit Morphology," Mrs Symp. Proc., V. 101, (1988) pp. 213–220 no month.

S.D. Allen, "Abstract: Laser Chemical Vapor Deposition of Metals and Insulators," *J. Vac. Sci. Tech.*, V. 16, No. 2, (Mar./Apr. 1979), p. 431.

O. Lehman, et al., "Three-Dimensional Laser Direct Writing of Electrically Conducting and isolating Microstructures," *Materials Letters*, V. 21, (Oct. 1994), pp. 131–136.

M. Boman, et al., "Helical Microstructures Grown By Laser Assisted Chemical Vapor Deposition," *IEEE Micro Electro Mechanical Systems Proc.*, (Feb. 1992), PP. 162–167.

D. Sander, et al., "Fabrication of Metallic Microstructures By Electroplating Using Deep–Etched Silicon Molds," *J. of Microelectromechanical Systems*, V. 4, No. 2, (Jun. 1995), pp. 81–85.

H. Guckel, et al., "Fabrication of Assembled Micromechanical Components Via Deep X-Ray Lithography," IEEE Micro Electro Mechcanical Systems Proc., (1991), pp. 74–79 no month.

Wallenderger et al., "Strong, Pure & Uniform Carbin Fibers Obtained Directly from the Vapor Phase", *Science*, vol. 260 (2 Apr. 1993) pp. 66–68.

FIG. 1 OVERALL SYSTEM

FIG. 2 CHAMBER

FIG. 4 THE PROCESS

FIG. 5A ARBITRARY SHAPE FORMING

FIG. 5B FORMING A SPHERE

FIG. 5C FINAL SPHERE

FIG. 6 SEPARATE FLOW

FIG. 7 TWO-PHASE FLOW

FIG. 8 TEMPERATURE-DEFINED GROWTH

FIG. 9 FLOW-DEFINED GROWTH

FIG. 10 MULTIPLE IMPINGING BEAMS AND/OR FLOWS

FIG. 11 ENCAPSULATED FLOW

METHOD AND APPARATUS FOR THE FREEFORM GROWTH OF THREE-DIMENSIONAL STRUCTURES USING PRESSURIZED PRECURSOR FLOWS AND GROWTH RATE CONTROL

BACKGROUND OF THE INVENTION

1. Technical Field

This invention generally relates to a method and apparatus for fabricating three-dimensional structures, and more specifically relates to the use of heat to selectively pyrolyze a fluid precursor, thereby depositing a solid of given shape and morphology.

2. Background Art

In creating three-dimensional mechanical shapes, most established technologies employ a "material deletion" philosophy, wherein one begins with a solid "blank" and removes bits of material until the desired pattern is achieved. The difficulty with this subtractive approach is that there always exist limitations on the ability of the "deletion agent" (e.g., a drill bit, EDM tool, or chemical etchant) to access all parts of the material blank. This in turn limits the processes' ability to create complex geometrical forms, especially in dealing with points interior to the blank. Thus, processes which employ this approach typically create only simple geometrical shapes: cuboids, cylinders, etc., or combinations of the same. These shapes must then be later assembled to form more complex geometries.

In contrast, additive manufacturing generates complex structures with internal features as readily as simple shapes, little post-assembly being required. Casting, extrusion, and powder metallurgy processes employ material addition. However, pre-formed moulds or dies are usually required to give the structure its particular shape. Often, it is not possible to generate internal or convoluted geometries with a mould, and again, assembly of two or more parts may be required to achieve a specific geometry. Fabricating a mould is often expensive and is not efficient except for large volume production.

To avoid problems associated with moulds and decrease development time, attempts have been made to fabricate mechanical structures using additive, layered manufacturing techniques. On the large scale, i.e. for centimeter to meter-sized objects, rapid prototyping processes such as stereolithography have been developed. In stereolithography, a laser is used to cure a photo- or heat-sensitive resin. Unfortunately, metals and ceramics may not be processed directly in this manner. In the case of 3-D printing, a bonding agent is used to pattern successive layers of powders, after which the powder assembly may be sintered to amalgamate the powder particles. In another example, U.S. Pat. No. 5,182,170, issued Jan. 26, 1993, parts are made by laser-sintering successive layers of powder material in a reactive gas environment, the vapor reacting with the powder so as to reduce, and thereby sinter, the powder. Difficulties arising with these processes include: dimensional control, warpage, and shrinkage of the part during the sintering and curing steps. Dimensional changes are often on the order of up to five to fifteen percent. Additional examples of such sintering or printing processes may be found in the following U.S. patents: U.S. Pat. No. 5,382,308, U.S. Pat. No. 5,296,062, and U.S. Pat. No. 5,156,697 issued to Bourell et al.; U.S. Pat. No. 5,340,656 and U.S. Pat. No. 5,204,055 issued to Sachs et al.; and U.S. Pat. No. 5,387,380 issued to Cima et al.

At present, there is no additive manufacturing process that in one step gives accurate computer-to-part rapid prototyping of metals and ceramics, without additional processing or machining. On the micron scale, surface micromachining has been used to create layered, three-dimensional micro mechanical parts. Various combinations of lithographic masking with other processes have been used, such as chemical vapor deposition (CVD), electro-plating, and physical vapor deposition (PVD). The extension of surface micro-machining to the manufacture of highly three-dimensional optical, mechanical, or fluidic components has been inhibited by the use of planar photolithographic imaging and the necessity of multiple layers to obtain shape in the third-dimension. The LIGA process, thick-resist lithography, and electro-forming processes are examples of methods which provide high-aspect-ratio three-dimensional parts by patterning thick layers of material. The shape of these parts, however, is limited to linear projections of the two-dimensional mask pattern, and, in all cases, etching of resist or bulk/sacrificial material is necessary to achieve the desired shape. Assembly is required to create more complex structures. The need for a more flexible, rapid, additive part-production tool at the micron to millimeter scale is apparent.

Laser-induced chemical vapor deposition (LCVD), another additive process, has been used in the direct-writing of custom interconnects for integrated circuits and electronic packaging on the micron scale. With this process, line traces, seldom thicker than 10 μm, have been grown using scanning laser beams, decomposing an ambient precursor gas at the beam focus. The technique has been limited, by and large, to the growth of thin films due to self-limiting of the line height, and overall volumetric deposition rates have been relatively small, less than $10^{-5}$ to $10^{-3}$ cubic millimeters per second, limiting the potential end size of deposits. LCVD has been used almost exclusively at low pressures (<1 bar) in chambers which are at room temperature, relying on the room-temperature vapor pressure of the precursors for growth, again limiting volumetric growth rates. While flows of precursor have been used to replenish depleted reactants in vacuum chambers during LCVD, directed flows of precursor material onto (or near) the deposit interface have not been used to locally-enhance growth rates or to shape the deposit. Additionally, no feedback control has been used to directly control the growth rate at the deposit interface.

In one example, U.S. Pat. No. 5,306,447, entitled "Method and Apparatus for Direct Use of Low Pressure Vapor From Liquid or Solid Precursors for Selected Area Laser Deposition," issued Apr. 26, 1994, and assigned to University of Texas System Board of Regents, discloses a method of using a laser for forming three-dimensional parts. One disadvantage of this technique is limited deposition rate; as in LCVD, a low pressure vapor is utilized, filling an unheated vacuum chamber to a pressure no higher than the ambient-temperature equilibrium partial pressure, thereby bounding the process to pressures less than 1 bar. Also, no attempt is made to monitor and control the growth or reaction rates during processing, so that the growth of successive layers becomes unstable, surface irregularities in one layer being amplified in the next.

A primary disadvantage of these and all similar techniques is that the final part is comprised of a plurality of joined planar layers, and hence may be subject to warpage and fracture at layer interfaces due to residual stress between layers. Thus, this and similar techniques do not allow for things such as edge acuity, part stability, speed, and resolution in the third dimension.

Some other examples of prior art that disclose creation of parts through laser fabrication are found in the following U.S. Patents and are hereby incorporated by reference: U.S. Pat. No. 5,169,579 issued to Marcus et al.; and U.S. Pat. No. 5,389,196 issued to Bloomstein et al.

Although the aforementioned patents and articles describe methods for producing three-dimensional parts through laser vapor deposition, only micro-scale parts such as constant-radii rods and splines (or simple combinations of the same) have been grown. Furthermore, since there is no real-time feedback control of the growth rate, growth contour, laser beam power, spot size, and/or profile in these references, the shapes of the parts thus grown continue to be limited to such forms, and dimensional control is poor. All reactions except one are performed in vacuum chambers at low pressure, thereby limiting the growth rate of the parts and the variety of materials which can be deposited. In no case, has there been any attempt to directly control the transport of reactants to the growth zone by forced convection or directed flows.

SUMMARY OF THE INVENTION

In order to avoid the disadvantages of the prior art, the present invention provides for continuous, freeform growth of multi-material, three-dimensional monolithic parts (hereafter termed "monolithic forms") with characteristic features on the sub-micron to decimeter scales. Complex structures are built-up as composites of these monolithic forms, largely eliminating the need for later assembly. No layering is required, and greater processing speed, edge acuity, resolution, and dimensional stability is possible than with the prior art.

The present invention comprises a method and apparatus for the selective thermally-induced deposition of solid material from gas-phase, liquid, or super-critical fluids to produce monolithic forms by pyrolysis of said fluids. The method involves directing flow(s) of precursor fluid(s) into a heated region at or near a deposit where growth may occur, while controlling the rate of deposition across the region by directly monitoring the growth rate(s), deposit profile, etc.

The deposition process to form a structure occurs within a pressurized chamber. Heat is generated at or in proximity to the growth interface in order to locally heat the adsorbed or surrounding precursor fluid(s) to a temperature which exceeds the threshold decomposition temperature of the precursor fluid(s). The reaction vessel is maintained at a constant temperature higher than that of the condensation temperature when operating in the gas-phase, and precursor gases may be pressurized and heated to the critical point or beyond, becoming super-critical fluids, without condensation to the liquid phase. This can be used to control the formation of "bubbles" which often occurs during pyrolysis of liquid or condensed precursors and which may interfere with the coherence of directed radiant energy beams. The deposit may also be heated directly via conduction to a temperature approaching, at, or beyond the threshold decomposition temperature of the fluid.

Growth occurs by diffusion of reactants to the growth zone through a boundary layer over the deposit. The thickness of the boundary layer is related to the orientation and velocity of the precursor flow relative to the growth zone. When the precursor is not forced to flow over the deposit area, this constitutes a quasi-static condition where natural convection and diffusion limit the reaction rate. When a high-velocity flow is impinged onto the deposit area, the boundary-layer is very thin and diffusion occurs over a short distance. The reaction rate is related to the distance over which diffusion must occur, the smaller the distance the faster the reaction rate and growth of deposit. As a precursor impinges onto the deposit surface, the concentration of reactants will decrease in the flow (and reaction products increase) as the fluid progresses across the growth zone. Pyrolysis occurs primarily at, or near the deposit surface upon first impinging—where the concentration of reactants is higher and boundary layer thinner; the pyrolysis decreases progressively at points farther from the impingement point. The reaction zone is defined by the region of enhanced growth at the impingement point.

Growth is also determined by the temperature distribution over the reaction zone. Growth occurs more rapidly where the temperature is higher, until some maximum diffusion-limited rate is obtained. Hence, a significant portion of this invention is the ability to control the selective growth of materials by using either or both of the aforementioned means. For example, either:

A) Directing a large-area impinging jet of precursor fluid(s) onto a deposit interface, while limiting the reaction zone to a smaller area determined solely by the size of the heated zone (e.g., through a directed beam of radiant energy); or B) Directing a small-area impinging jet of precursor fluid onto a deposit interface, where the heated region is larger than the jet size. In this case, growth occurs mostly near the impingement spot, the reactant thereafter being depleted in the flow, and growth being inhibited at more distant locations on the deposit interface by a thick boundary layer. In the extreme case, no selective heating is necessary, the entire deposit being heated uniformly at or above the precursor decomposition temperature; or C) A selective combination of both methods (A) and (B) above.

Another primary feature of the invention is the inclusion of a powder admixture into the precursor flow. This mixture may then be flowed jointly at high pressures, creating a two-phase flow facilitated by increased viscosity of the precursor fluid at high pressures. Alternatively, the powder may be flowed separately from the precursor, with or without the use of a carrier fluid. Powder may also be generated within a precursor flow by pre-heating or photo-decomposition of a precursor fluid, powder particles nucleating from the fluid-phase. The solid powder adds bulk volume (thereby increasing the overall growth rate) and unique properties to the final deposit.

Feedback is used to control the evolving part shape by monitoring the volumetric deposition rate(s) and profiles across the growth zone, and correcting the temperature gradient and/or concentration of reactants at this zone so as to produce the desired growth. This is accomplished by modifying the heat source attributes (e.g., radiant beam energy, size, etc.), changing the position and orientation of the deposit relative to the growth zone, and/or modifying the pressure and flow of reactants to this zone.

Advantages resulting from the present invention can be explained as follows: Because continual control of the deposition rate across the growth zone is obtained through feedback of temperature and/or composition, the process becomes stable, resulting in the ability to grow freely in the third dimension, so that layering is not required to produce arbitrarily-shaped forms. The continual control across the growth zone also allows the internal structure of the deposit to be tailored, providing uniform parts which are not subject to fracture. Very large deposition rates are attained through the use of pressurized flows which decrease the distance over which diffusion of products and reactants must occur. The rate increase allows large as well as submicron-sized components to be fabricated; the result being a process which provides for edge acuity and resolution over a wide range of scale so that fine details may be generated as readily as the bulk overall part shape. Additionally, the use of high pressures allows the growth of amorphous or fine-grained polycrystalline materials which may have greater strength or novel material properties. By varying the precursor flows, the deposit composition can be changed, so that differing materials may be deposited as needed—to tailor a part's function. For instance, electrically conductive materials can be encapsulated within dielectrics, or sacrificial layers can be generated for later removal, separating components of a device. Through the simultaneous use of multiple precursors, blends of materials within a monolithic form are possible; one material may be transitioned into another without distinct boundaries, thereby increasing cohesion between differing materials or monolithic forms.

The foregoing and other features and advantages of the invention will be apparent from the following more particular description of preferred embodiments of the invention, as illustrated in the accompanying drawings.

BRIEF DESCRIPTION OF DRAWINGS

The preferred exemplary embodiments of the present invention will hereinafter be described in conjunction with the appended drawings, where like designations denote like elements.

DETAILED DESCRIPTION OF THE DRAWINGS

Figure 1:
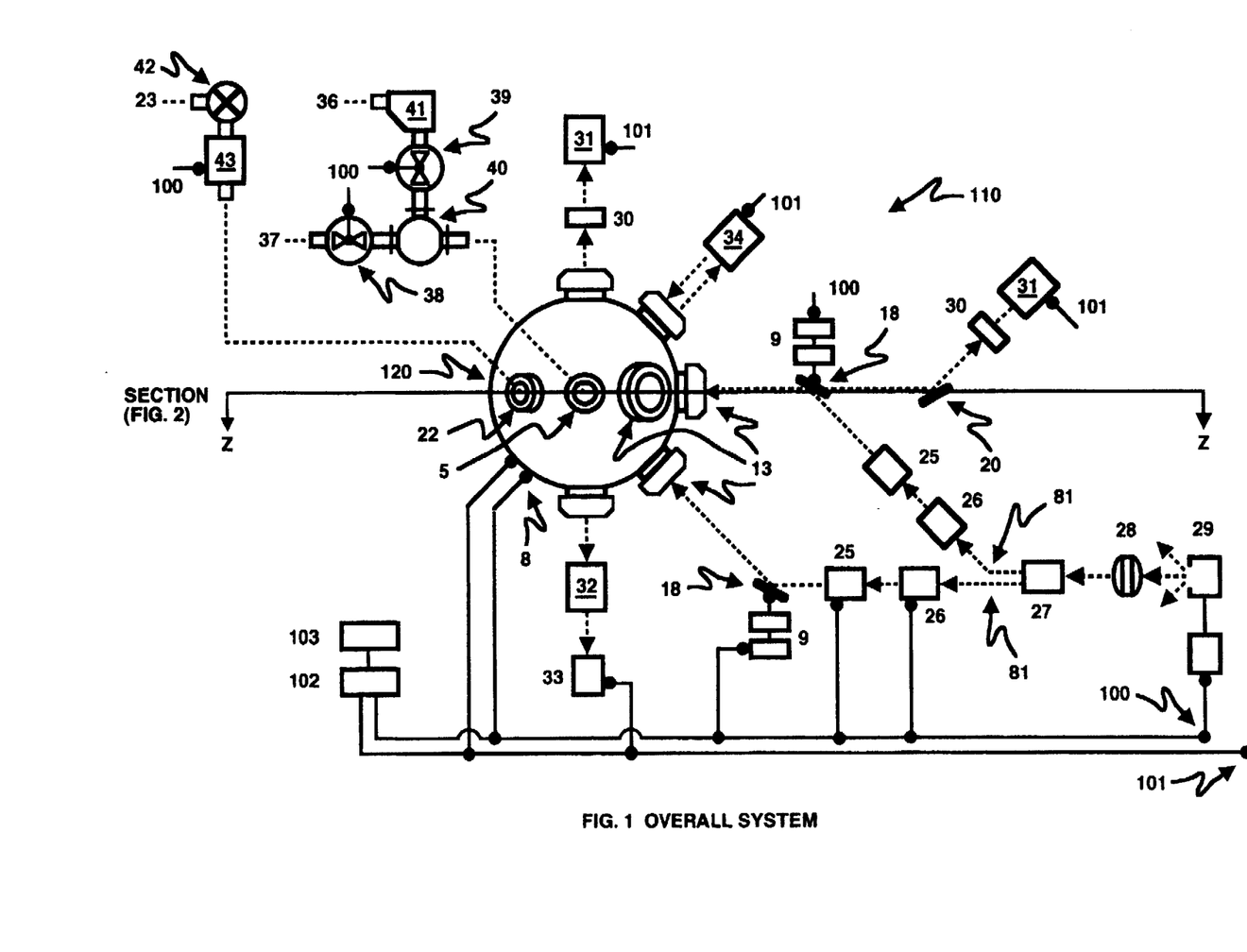
FIG. 1 is a block diagram of the system used in accordance with an embodiment of the present invention.

Referring to FIG. 1, a system 110 used for producing three-dimensional structures in accordance with an embodiment of the present invention is shown. It is to be understood that this is an exemplary embodiment, and that a variety of configurations are possible without departing from the spirit and scope of the invention. The system 110 comprises a chamber 120 having a focusing lens or window 13 and input apertures for a heating fluid jacket 22 and precursor flows 5. The chamber and its associated deposit positioning system will be discussed in more detail in FIG. 2. The system further comprises a source of heat, including both a radiative 29, and/or a conductive source of heat, with their accompanying parts, a chamber temperature controller 42 and 43, a powder and fluid injector 36-41, and feedback device 101.

Figure 4:
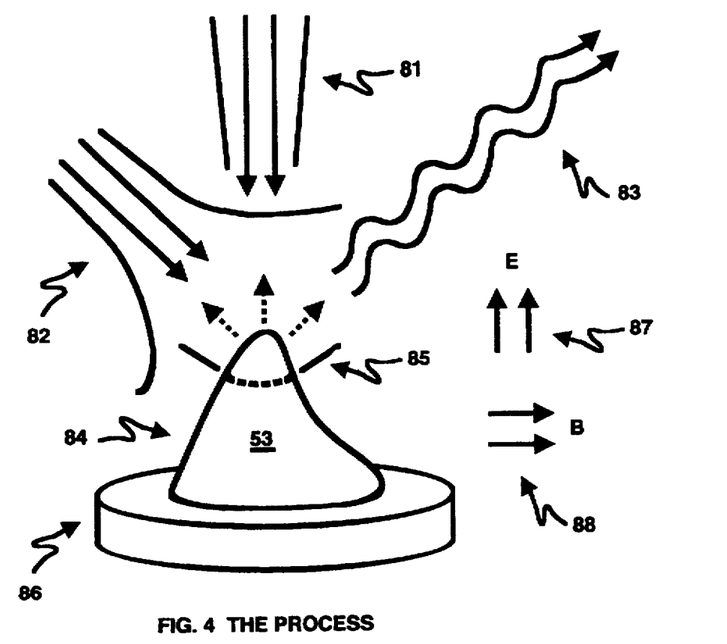
FIG. 4 illustrates various components that are used in shaping the three-dimensional structure in accordance with the present invention.

The radiant energy source 29 emits electromagnetic radiation of specific wavelength bands into a collimating lens 28, which produces a directed beam of electromagnetic energy 81. The radiant energy source 29 may be a laser, lamp, antenna, oscillator, or other apparatus that produces intense electromagnetic energy 81, which may be focused onto a growth zone (see FIG. 4 for reference to the growth zone). The source 29 may also have filters, which pass only desired wavelength bands. The transmitted wavelength(s) of the radiative beam 81 are chosen so that they may pass mostly-uninhibited through the precursor fluid and heating-jacket fluid, but may be absorbed and thus converted to heat by the solid deposit 1 and/or the impinging flows 6 (shown in FIG. 2). The generated heat is then used to pyrolyze precursor molecules (as shown in FIG.4). In the preferred embodiment, the radiant energy beam 81 is split with a beam splitter 27. Each beam thus produced then passes through electronically-controlled attenuators 26, which control the beams' respective intensities. The beams next travel through beam profiler(s) 25. A beam profiler 25 is an optical device that distributes the radiant energy of the beam across the cross section of the beam, thereby making the beam intensity gaussian-shaped, flat-topped, etc. This distribution is the beam intensity profile. The beam cross-section need not be circular, and the intensity profile may be chosen arbitrarily. A mirror 18, attached to alignment device 9, aligns the beam with the X-Y-angle stages of 9. The aligned beam then enters the chamber through focusing window 13. Element 18 may also be a beam-splitter to allow viewing through 18 from position 20, and it may be repositioned at will, to scan the beam across the targeted growth zone, if so desired. A heated sample holder (See FIG. 4) may also be used as a heat source to warm the growth zone directly via conduction and is further described in FIG. 4. In the preferred embodiment, the precursor fluid(s) and powder admixture(s) may also be pre-heated prior to entering the chamber.

Figure 2:
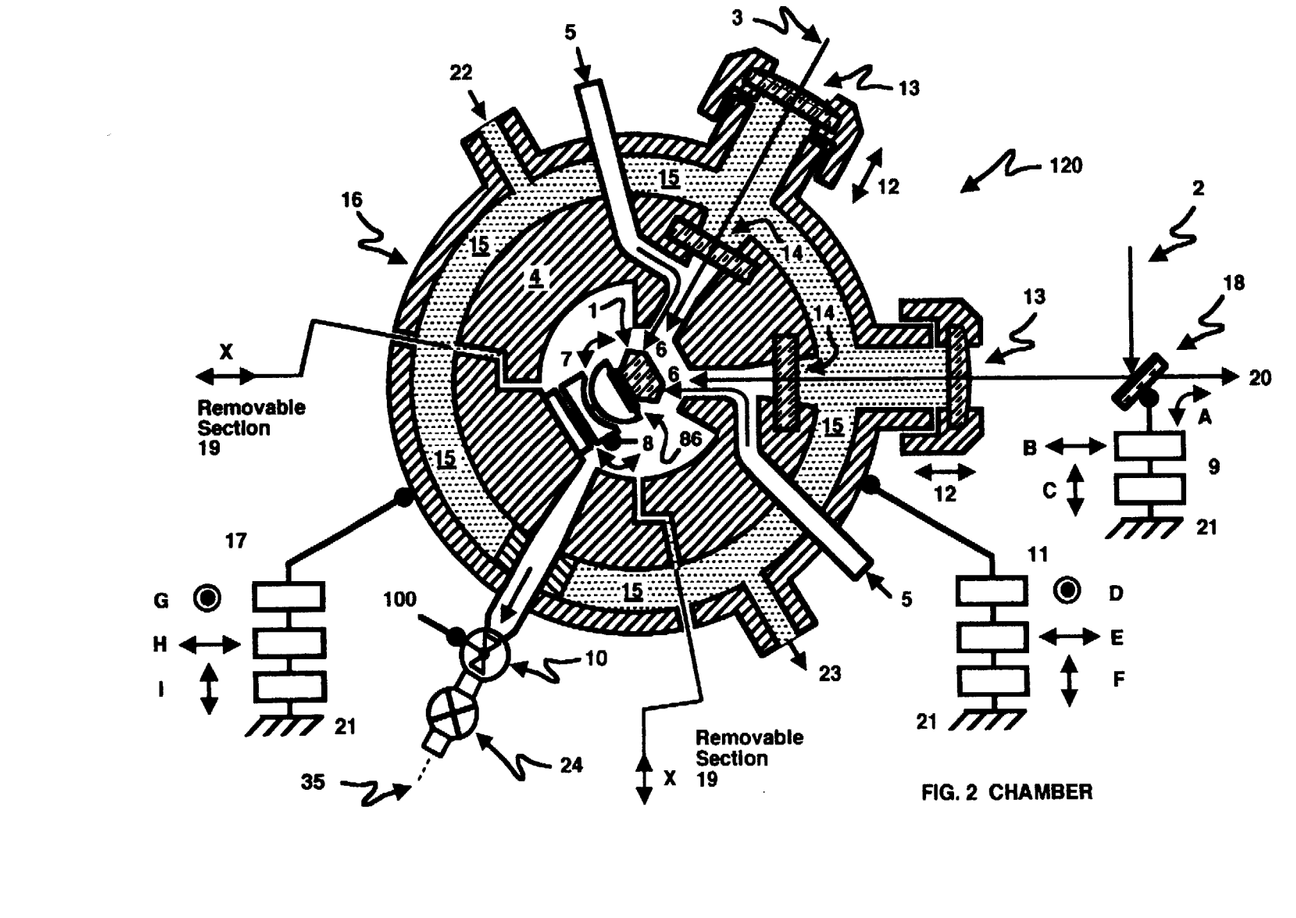
FIG. 2 is an exploded view of an exemplary embodiment of the chamber as illustrated through section Z—Z in the system of FIG. 1.

Powder and fluid precursor(s) are injected from a mixer 40 into the chamber 120 through aperture 5. The source of fluid precursor 37, delivers the precursor fluid into a metering valve 38, which controls the input rate of the precursor. The precursor may be previously unused, as from a gas cylinder or other pressurized source, or may be recycled, as from 35 (shown in FIG. 2). The metered precursor will then combine with a powder, if desired, in a three-way valve and mixer 40. The source of powder 36 is stored in a storage bin 41. The powder may be previously unused or recycled powder that comes from a powder/precursor separator (as shown in FIG. 2), or the powder may be generated in-situ by pre-heating or photolyzing a precursor fluid. When generated outside the chamber, the powder then enters into a powder metering valve 39, which controls the input flow of powder. As aforementioned, when powder is used, it may be mixed with the precursor, or some other carrier fluid, in mixer 40. The mixture then enters the chamber 120 through aperture 5.

The temperature controller consists of a pump 42 for circulating a jacket fluid, an output line 23 for the jacket fluid, and a heater/cooler 43 for maintaining the set temperature of the jacket fluid.

The system 110 is controlled through a computer 103 and data acquisition hardware (system controller) 102 through device driver lines bus 100.

Feedback for the system 110 is provided through feedback lines bus 101. A filter 30 is provided to remove the beam's wavelengths which may cause glare, or to view a specific wavelength band. A CCD camera or photodetector 31 then monitors emissions from the reaction. A monochromator or spectrograph 32 breaks the beam into its component wavelengths. A CCD or photodetector 33 monitors this spectrum to determine blackbody and spectral-line emissions and/or absorptions, which are used to determine the temperature and growth rate at the sample, respectively. A detector 34 is used to determine the internal crystal structure of the deposit as it grows remotely. The preferred embodiment detector 34 is a "laser ultrasonic" detector, made by Textron Systems, but it is to be understood that any other appropriate detector may be used and the invention is not bound to such.

FIG. 2 shows the chamber 120 of FIG. 1 as seen through cross-section Z—Z. The chamber comprises an outer chamber wall 16 and an inner chamber wall 4. The jacket fluid 15 flows in the space between the chamber walls 4, 16. The inner chamber is a pressurized, thick-walled chamber made of stainless steel for the preferred embodiment but may also be made of any other suitable material. A removable section 19 is available for accessing the sample holder 86 and the sample 1 which has been deposited. The jacket fluid 15 enters through heating input line 22 and exits through output line 23. The purpose of the heating/cooling jacket is to maintain the windows 13, 14 and chamber walls 4 at a constant temperature. The jacket fluid 15 maintains the inner chamber at a constant temperature that is higher than that of the condensation temperature when operating with gas-phase precursors, or solidification temperature of liquid or super-critical precursor fluids when operating in these phases. Precursor gases may be pressurized and heated to the critical point or beyond, becoming super-critical fluids, without condensation to the liquid phase. This prevents condensation and/or solidification of the precursor or carrier gases which may interfere with transmission of the beams 2,3, or reduce the flow(s) 6 to the sample. Likewise, when liquid precursors are employed, the chamber may be pressurized to control the formation of gaseous "bubbles," near the growth zone, as desired. The deposit may also be heated directly to a temperature approaching, at, or beyond the decomposition temperature of the precursor fluid. Typically, the inner chamber walls 4, and windows 14 are maintained at a temperature below the threshold decomposition temperature of the precursor to eliminate unwanted deposition on these parts.

The powder and the precursor enter though input line 5 and are directed as flow(s) 6 toward the deposit interface 1. The direction, velocity, cross-sectional size and shape, etc. of these flows may be chosen arbitrarily. Control and electrical signals may be brought into the chamber via a feedthrough connector 8. The deposit interface 1 is observed through high-pressure laser window(s) 14 and focusing lens/window(s) 13, which is adjustable 12 to allow focusing of beams 2, 3. This adjustment may be used to control the size and definition of the radiant beam at the growth zone.

The positions of chamber 120 and beam(s) 2, 3 are adjustable, so that the deposit interface 1, attached to 120 through the sample holder 86 and positioning device 7, may be moved relative to the beams 2, 3. In addition, the sample 1 may be positioned and oriented independently relative to 120, so that the impinging flows 6 and beams 2, 3 may be directed to any location (at any orientation) to the sample 1. This permits true freeform growth of the sample 1. Beam 2 is reflected off mirror 18, which is adjustable in directions A, B, and C by positioning devices 9. All input radiant beams are assumed to be adjustable in this manner. Positioning devices 11 locate and orient the chamber relative to the global reference frame along directions D, E, and F. Devices 11 are used specifically for positioning the chamber relative to the input beams. Device 17 operates solely as the positioning stage(s) to retract section 19 X—X between processing runs so that sample 1 may be accessed; motion of section 19 occurs along directions G, H, and I. Sample positioning device 7 orients the sample through several stages, beginning with a goniometer at the sample holder, which provides a tilt (i.e. altitudinal) adjustment. The goniometer is then oriented in azimuth via a rotational stage, and X-Y-Z positioning relative to 120 is thereafter effected via linear positioning stages. This arrangement provides for arbitrary orientation of the sample relative to beams 2, 3 independent of the location of the impingement zone on the sample or position of chamber 120 relative to the beams 2, 3. Control signals to positioning device 7 are made via an electrical feedthrough 8 in the chamber wall 4.

The chamber 120 may also have a system pump 24 for initial evacuation of chamber 120 and the re-circulating and re-pressurizing of precursor material for recycling or disposal. The pressure in the chamber may be controlled through the exit valve 10, which precedes the system pump 24.

Figure 3:
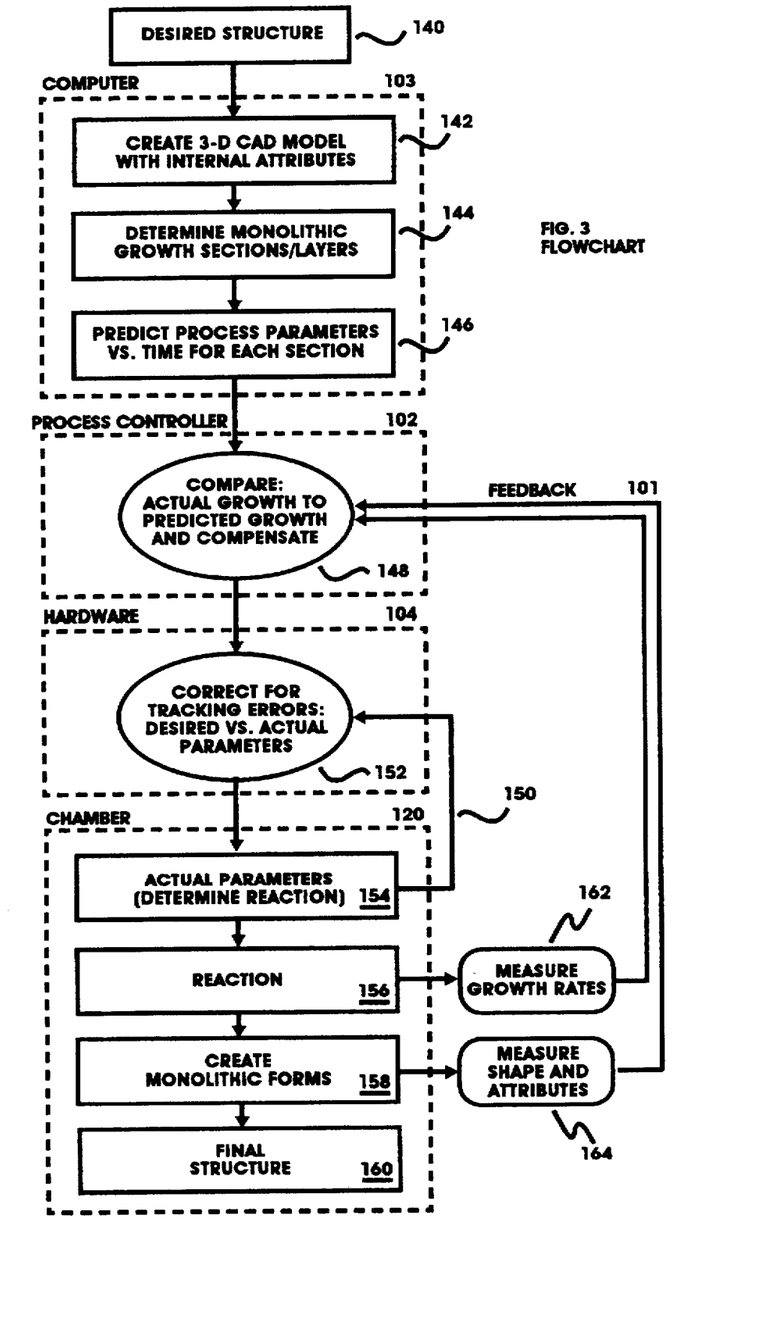
FIG. 3 is an exemplary flowchart illustrating the methodology used in the system of FIG. 1 in accordance with the present invention.

The control and growth methodology for generating a desired structure using the present invention is shown in FIG. 3. The desired structure 140 is input into a computer 103, a 3-D representation being created with the structure's shape and internal attributes, such as material type, crystal structure, porosity, etc. (step 142). The model may be created with a suitable CAD program or any other similar program. The required monolithic forms and the growth rates to generate each form are then determined in step 144, and the process parameters versus time for each form are subsequently predicted (step 146). Within step 146, the required conditions to deposit each monolithic form are first predicted, such as the time-dependent temperature(s) and precursor concentration(s) at the growth zone. Then, specific process parameters are estimated for the time of growth, such as the: required size of the beam focus; cross-sectional shape of said focus; intensity and profile of said focus; set chamber pressure; precursor/powder flow velocities; precursor/powder flow rate(s); impingement flow directions; and nozzle shape for each flow.

Finally, the positions and orientations of the beams 2, 3 and flows 6 relative to the sample 1 are estimated for the growth of each monolithic form. These time-dependent positions and orientations are used to calculate the position, velocity and acceleration of each degree of freedom in hardware adjustments 7, 9, 11, and 12. These variables are also process parameters.

The growth process now begins using the process parameters predicted by the computer 103. The process controller 102 compares the actual growth to the predicted growth (step 148) using feedback bus 101 and compensates for any observed differences. A key element in the system's methodology is the direct feedback control of the growth rate 101 (step 148). The feedback allows control of the non-linear and often unstable growth rate (which typically displays an exponential dependence on temperature), so that the deposition rate can be maintained at a particular set-point, regardless of perturbations such as surface irregularities, flow variations, etc.

The various hardware devices 104 in the system (comprising devices 7, 9, 10, 11, 25, 26, 29, 38, 39, 43, etc.) are driven through bus 100. Each of the hardware 104 may then have the ability to independently correct for tracking errors between the desired versus actual process parameters (step 152) through a feedback loop 150 where the actual position, orientation, flowrates, etc. are monitored.

Finally, in the chamber 120, the actual process parameters 154 drive the growth reaction 156 which is taking place. The reaction 156 and resulting monolithic form(s) 158 are monitored though feedback 101 by measuring growth rates (step 162) and shape and morphology (step 164) of the deposit. A multiplicity of monolithic forms may be grown, creating the final structure 160.

Growth rates are measured through spectral emission/absorption intensities, and temperatures through the blackbody intensity curve(s). For these measurements, any source within the vicinity of the reaction zone may be used as dictated by the physics involved; radiation produced or absorbed by the deposit material(s), the precursor material (s), and/or the various precursor decomposition products may be measured. In the preferred embodiment, the internal crystal structure and composition of a growing deposit can be determined through a variety of methods, including, but not limited to: vision/interference systems 31, laser acoustic monitors 34 (referred to previously), and/or x-ray photoelectron spectrometers (XPS), x-ray diffractometers, etc.

As shown in FIG. 4, the growth of the monolithic forms 158 of FIG. 3 is achieved through a series of steps. The first step is directing precursor material 82 onto the deposit interface 84, so as to produce a specified concentration of the precursor at or near the deposit. The precursor material may include, but is not limited to, a gas, a liquid, a super-critical fluid, etc. which decomposes when heated beyond a threshold temperature. The precursor material may be used with a solid powder admixture, as will be described in FIGS. 6 and 7, or without a powder.

The next step is to create a region of elevated temperature at or near the deposit interface 84, characterized by a temperature gradient where at least a portion of the region exceeds the threshold decomposition temperature of the precursor. This induces a pyrolytic reaction 156 of the precursor material to form a deposit, the deposit evolving into a three-dimensional monolithic form 53. The region where growth occurs is defined as the growth zone 85. By varying the precursor(s) employed, different materials may be deposited, so as to produce alloys, sacrificial layers or material blends. The deposit may be composed of any material, including, but not limited to, refractory metals, transition metals, semiconductors, non-metals, metallic alloys, intermetallics, shape-memory alloys, ceramics, superconductors, and metallic carbides, oxides, nitrides, and borides.

The precursor material may be heated in several fashions, usually by proximity or contact with the deposit surface at the growth zone 85. It may also be heated directly in the fluid-phase by the radiative beam(s) 81 (referred to as 2.3 in FIG. 2). The deposit itself may be heated through conduction from the sample holder 86 and/or selectively heated by the absorption of radiation from the beams 81.

An electrostatic field 87 or magnetic field 88 may also be applied at or proximate to the growth zone 85 to enhance deposition in the region, separate by-products from the flow, direct charged flows, and/or generate preferred atomic or crystal orientations within the depositing material. These field(s) could additionally be used to select, control, and/or limit the growth rate over the deposit interface 84. Finally, the fields may also be used to enhance emission signatures from the pyrolytic reaction.

Emissions 83 from the growth zone 85 are monitored, as described above. The growth of the deposit may be controlled with the feedback 101 of the pyrolytic reaction rate 162, and the shape and the morphology of the deposit 164. The final step is the formation of a three-dimensional structure 160 from the feedback control 101 of the continuous growth of the deposit.

Figure 5A:
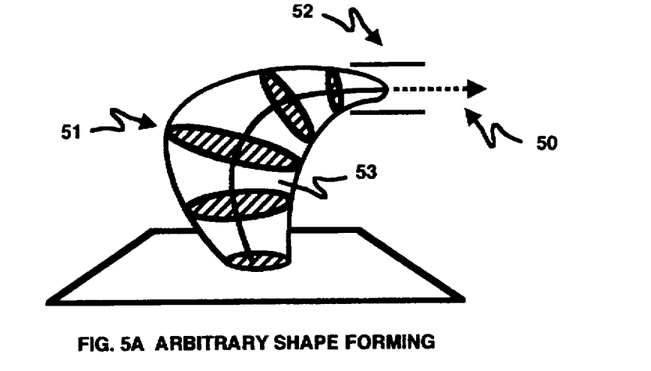
FIGS. 5A, 5B, and 5C show various examples of freeform growth using the methodology of FIG. 3.
Figure 5B:
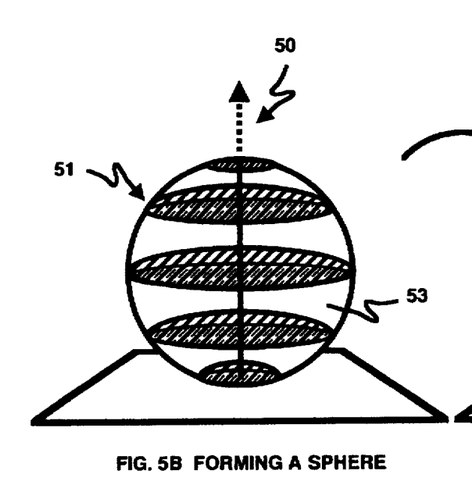
Figure 5C:
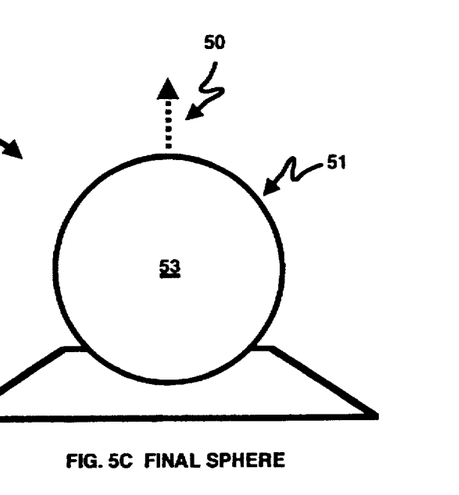

One feature of the invention is the ability to form any shape or part through freeform growth. The invention is not limited to forming constant radii forms, or shapes formed by layered growth. FIGS. 5A, 5B, and 5C illustrate examples of some freeform shapes (monolithic forms) 53 grown through the steps of the present invention as outlined in FIG. 3. In FIG. 5A, a completely arbitrary monolithic form is represented 53, while in FIG. 5B and 5C, the final monolithic form is presumed to be a sphere, a common shape in mechanical systems.

The instantaneous direction of the growth is represented by arrow 50. The growth zones at various instances of time during the evolution of the part are represented by the instantaneous contours 51. As can be seen in FIG. 5A, the direction of the growth 50 is not limited to one direction. Furthermore, the instantaneous contours may vary in size and shape during evolution of the monolithic forms 53. FIG. 5B shows contours with circular cross-sections in all cases, whereas FIG. 5A shows use of both circular and elliptical cross-sections. Other contour cross-sections such as squares or thin lines, etc. are possible. Finally, the magnitude of growth across a contour is not generally constant, and hence the instantaneous contours are not necessarily planar; rather, the growth contour usually exhibits an instantaneous curvature or topology. For example, the instantaneous contour may be flat-topped, as shown in FIG. 5A, convex, as shown in FIG. 5B, Gaussian, such as is common with the use of laser beams, or of any desired profile which will allow generation of the final monolithic form 53. The overall shape and size of the final monolithic form 53 is obtained through the integration of its instantaneous contours along the growth vector 50.

The size, shape, and curvature of instantaneous contours is generally related to the history of the temperature across the contour and/or the concentration of available reactants at the contour surface. These in turn are determined by the attributes of the impinging beams and precursor flows; such attributes include, but are not limited to: the size of the focused beam(s), the shape of the focused beam, the velocity and direction of the precursor flow, and the thermophysical properties of the deposit and precursor material(s) used, etc.

Figure 6:
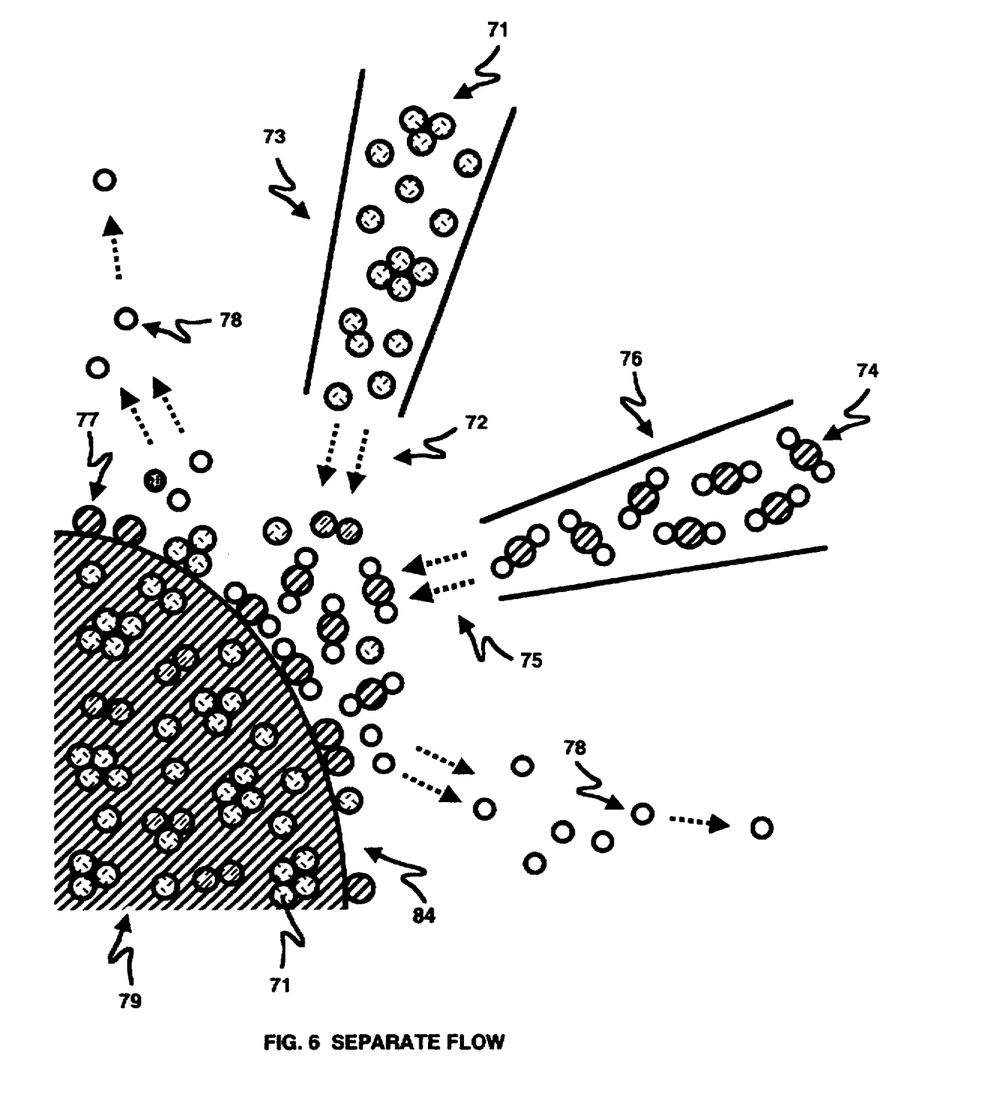
FIGS. 6 and 7 show various exemplary techniques for directing the precursor and powder material into the chamber in accordance with the present invention.
Figure 7:
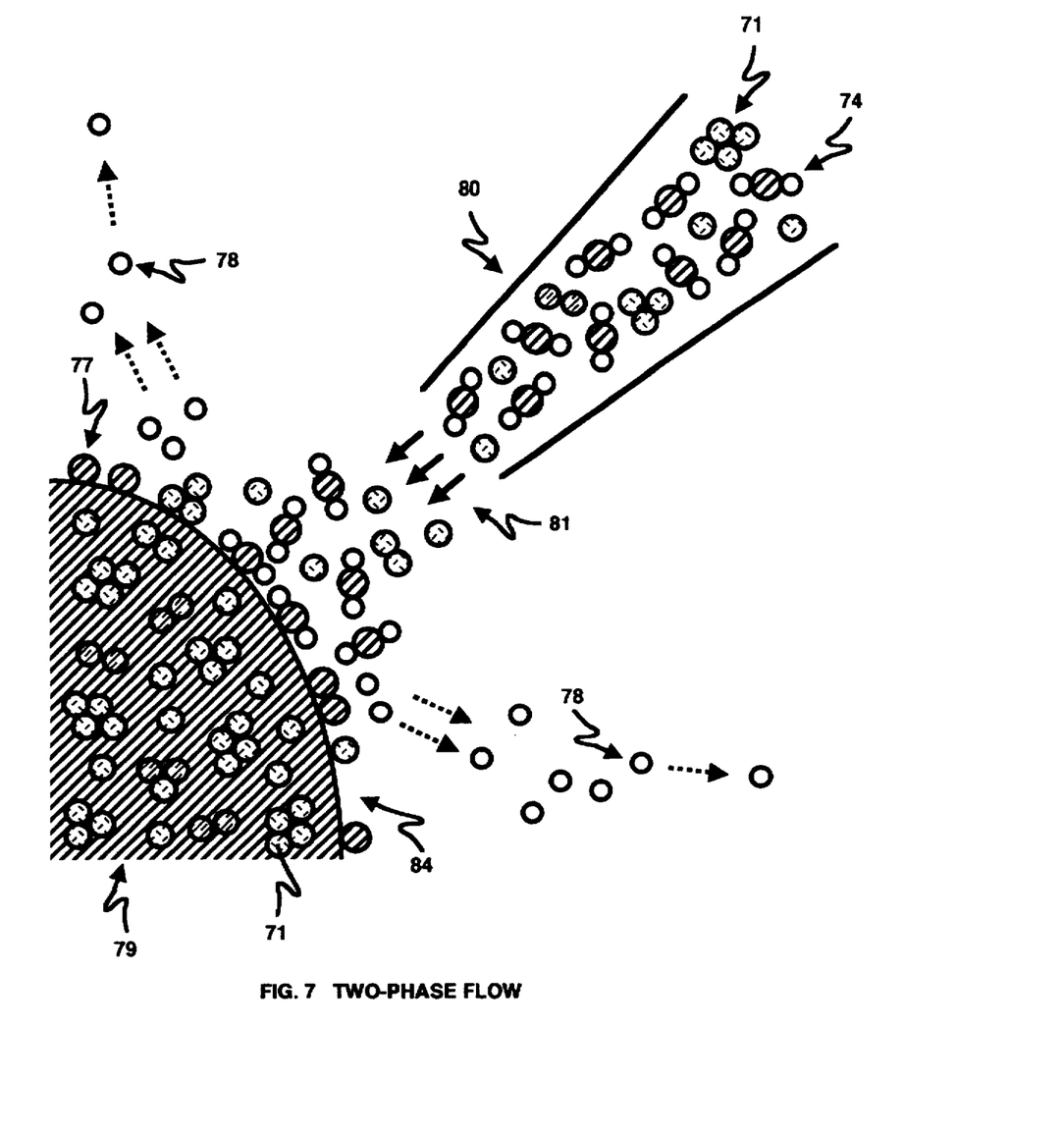

As discussed previously, a powdered admixture may be used with the precursor material in forming a part. FIGS. 6 and 7 illustrate two methods of applying both materials to the deposit interface to produce a part. As shown in FIG. 6, the precursor molecules 74 and the powder particles 71 are in two separate flows 76 and 73 which are directed along the vectors 72 and 75. The precursor molecule 74 in this example is represented by one large central (metal) atom and two smaller ligand atoms, and the powder particles 71 are represented by one or more clusters of light-colored (refractory) atoms. (The specific number of ligands and atom types are given for illustrative purposes only.) The flows of powder 73 and precursor 76 will meet at a surface of a heated deposit interface 84 where growth can occur. Once a decomposition temperature is reached, a pyrolytic reaction occurs, causing the ligands 78 to detach and the adsorbed central atom from the precursor 77 to bind with other adsorbed precursor atoms 79, powder particles 71, and/or the deposit interface 84. The free ligands 78 diffuse away from the growth zone and may inhibit the transport of precursor to the remainder of the deposit interface. Powder particles 71 may form nuclei, onto which the precursor may adsorb and form deposits, until coalescence with other nuclei and/or the deposit interface may occur. The deposition of the precursor central atom(s) fills the voids between nuclei. The powder need not be a catalyst for the pyrolytic reaction; rather it provides volume and gives the deposit useful properties.

FIG. 7 illustrates the precursor molecules 74 and the powder particles 71 flowing jointly at high-pressures, creating a single two-phase flow 80 facilitated by the increased viscosity of the precursor material at high pressures. Again, the flow of powder and precursor 80 will impinge on a surface of a heated deposit interface 84 where growth can occur. As before, once a decomposition temperature is reached, a pyrolytic reaction will occur, causing the ligands 78 to detach and the adsorbed binding atom from the precursor 77 to bind with other adsorbed precursor atoms 79, powder particles 71, and/or the deposit interface 84. The free ligands 78 diffuse away from the growth zone and may inhibit the transport of precursor to the remainder of the deposit interface. Again, the use of a powder admixture is intended to increase the overall volumetric growth rate and to provide useful deposit physical properties.

Figure 8:
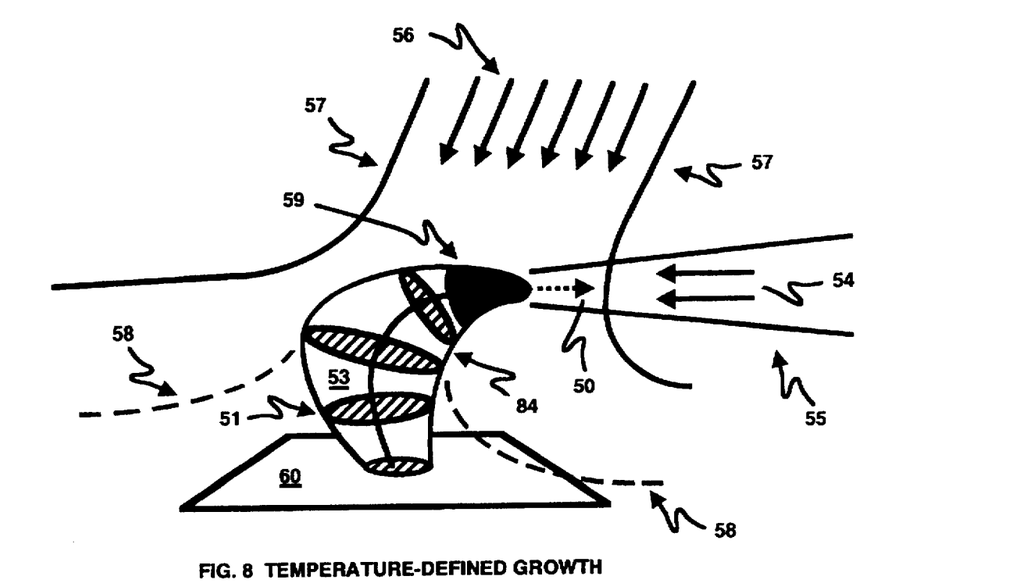
FIGS. 8 and 9 illustrate various exemplary techniques for defining the growth zone of the precursor material of FIG. 4.
Figure 9:
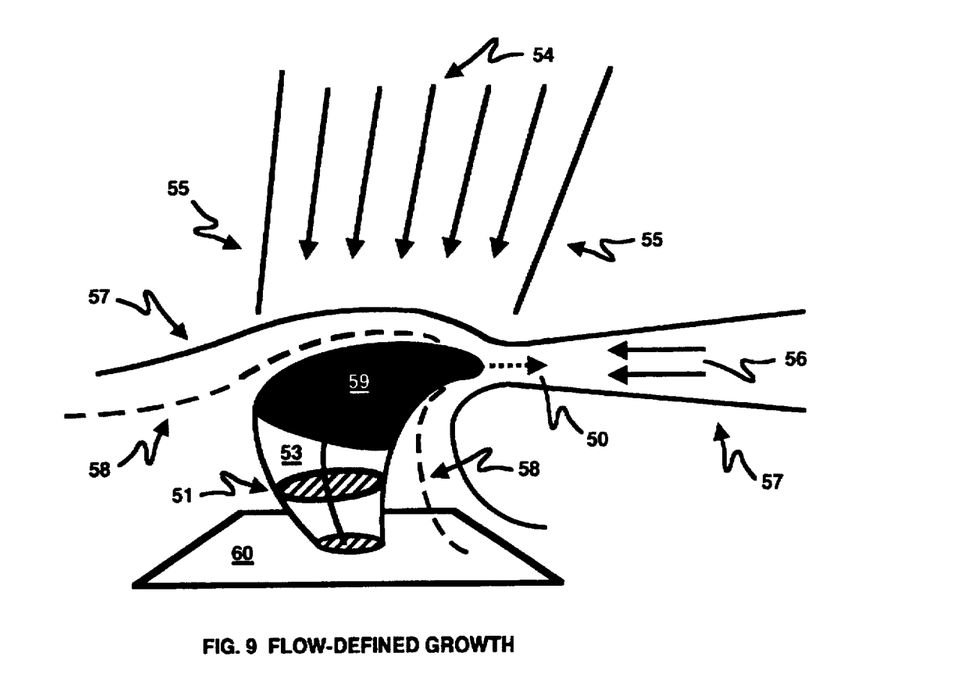

FIGS. 8 and 9 depict how the growth zone may be confined either through the surface temperature, i.e. temperature-defined growth (FIG. 8), or though the thickness of the boundary layer and surface concentration of reactants, i.e. flow-defined growth (FIG. 9). As in FIG. 5, the direction of growth is depicted through arrow 50. The deposit 53 is grown on a substrate, sample holder, or other section of the structure being grown 60. In both examples (FIG. 8 and 9), a light beam 54, falling within the boundaries as defined by 55, creates a region of elevated temperature 59 where growth may occur, and an impinging jet 56 flows past the growth zone; in both cases, the impinging flow falls within the boundaries 57, and the boundary layer around the deposit is represented by the dashed lines 58.

As shown in both FIGS. 8 and 9, growth occurs by diffusion of reactants to the heated zone 59 through a boundary layer 58 over the deposit. The thickness of the boundary layer is related to the orientation and velocity of the precursor flow 56 relative to the heated zone 59. When the precursor 56 is not forced to flow over the deposit area, natural convection and diffusion limit the reaction rate. When a high-velocity flow 57 is impinged onto the deposit area, the boundary-layer is relatively thin and diffusion occurs over a short distance. As the reaction rate is related to the distance over which diffusion must occur, the rate is greatest where the boundary layer is thin.

In temperature-defined growth (FIG. 8), a large-area impinging jet of precursor material 56 is directed onto the deposit interface, and the reaction zone is confined to the small area where the temperature is highest (i.e., the black areas of temperature gradient 59). In this case, the growth rate is characterized by an activation energy, until some maximum diffusion-limited rate is obtained.

In contrast, FIG. 9 shows a small-area of precursor material directed onto a deposit interface, where the heated region 59 is larger than the jet size. As the precursor 56 impinges onto the deposit surface 53, the concentration of reactants decreases in the flow 57 (while reaction products increase), and the boundary layer 58 thickens as the fluid progresses away from the growth zone and slows. Hence, pyrolysis occurs primarily at, or near the impingement point, where the concentration of reactants is highest and boundary layer thinnest. The deposition rate is characterized by enhanced growth at the impingement point, and greatly diminished growth at points farther down the flow. In flow defined-growth, the size of the heated zone typically exceeds the growth zone and does not select the region of growth. In the extreme case, the heated region may extend across the entire deposit, selective, rapid growth occurring only near the flow impingement point. In this case, no heat source other than a substrate heater 86 (such as in FIG. 4) is required.

It must be understood that in many cases, a combination of both temperature and flow-defined growth may exist, and the combination may be used to advantage in generating part shapes.

Figure 10:
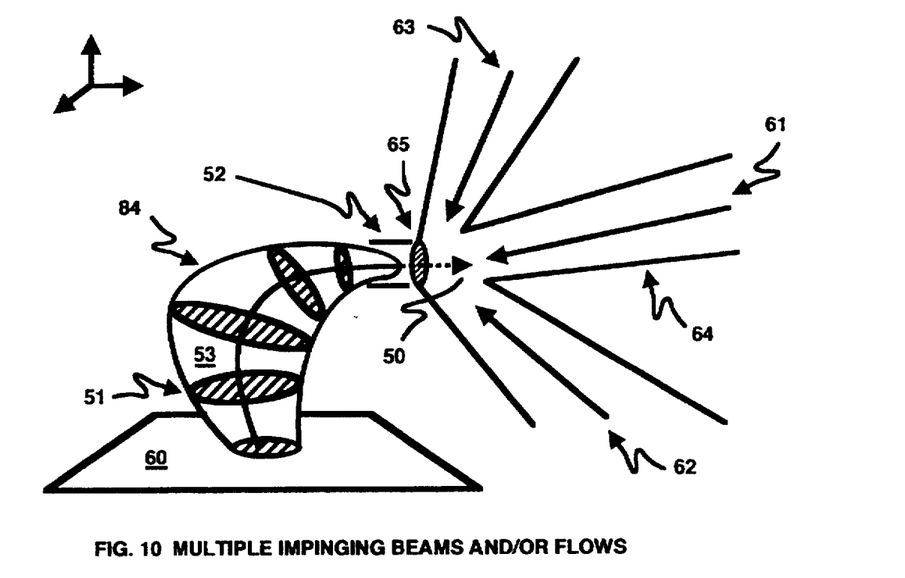
FIG. 10 illustrates the use of a plurality of beams and/or flows in the systems of FIG. 1.

FIG. 10 depicts the use of three beams, or 3 impinging jets, 61–63 in the growth of a deposit 53. The use of multiple beams or jets allows the selection of the growth direction 50 as the sum of components 61–63. In flow-defined growth, the sum of the jets 65 gives the net effect, while in temperature-defined growth, the intersection of the multiple beams 65 defines the region of elevated temperature on the deposit. Any number of beams and/or jets may be used, as desired.

Figure 11:
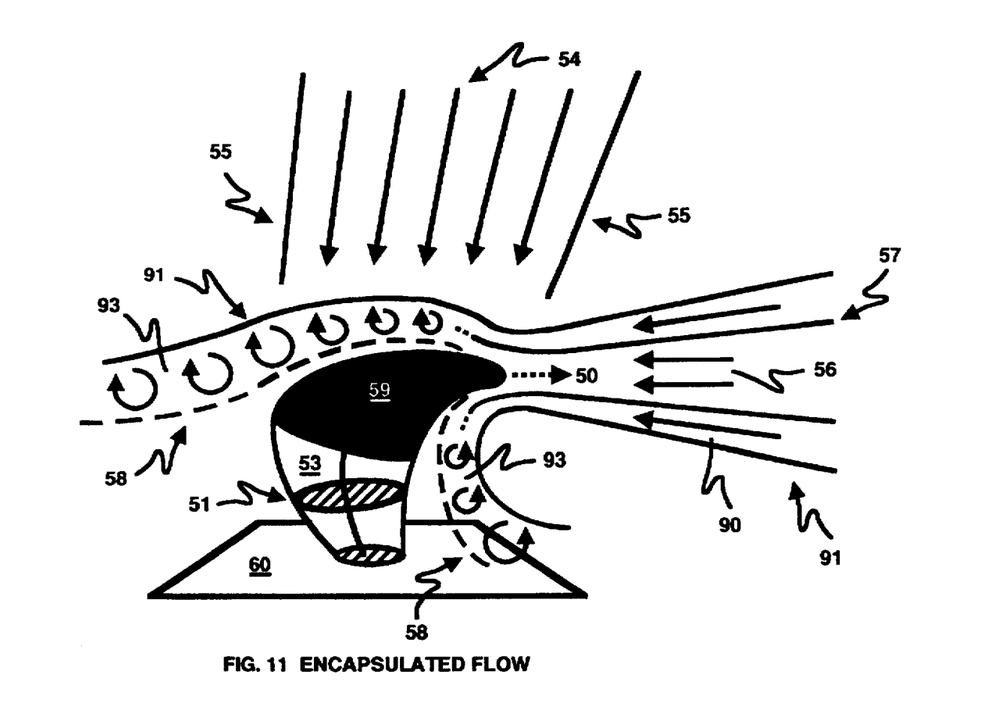
FIG. 11 illustrates the use of diluent flows to dilute a precursor flow outside of the growth zone of FIG. 4.

FIG. 11 illustrates the use of diluent flows 91, where an inert or non-reactive fluid 90 is used to dilute a precursor flow 56 outside of the growth zone 85 by turbulent mixing 93, further lowering the concentration of precursor in and around the boundary layer 58 and inhibiting growth away from this zone.

While the invention has been particularly shown and described with reference to preferred exemplary embodiments thereof, it will be understood by those skilled in the art that various changes in form and details may be made therein without departing from the spirit and scope of the invention.

What is claimed is:

1. A method of growing a structure, comprising steps of:
   A) directing a forced flow of precursor material onto a deposit interface;
   B) inducing a localized pyrolytic reaction of said precursor material with a temperature, wherein said localized pyrolytic reaction results in a growth of said deposit interface;
   C) controlling a growth direction, and a cross-section of said growth of said deposit interface with said temperature and a flow direction and flowrate of said forced flow that varies said cross-section and said growth direction; and
   D) forming a jointless, solid structure of said varied cross-section and said varied growth direction through said controlled growth of said deposit interface, wherein said forced flow is of smaller cross-section than said cross-section of said solid structure being grown by said forced flow.

2. The method of claim 1, wherein said jointless, solid structure is non-symmetrical.

3. The method of claim 1, further comprising steps of:
   C1) measuring a characteristic of said localized pyrolytic reaction; and
   C2) automatically controlling in real time said temperature and said flow direction and said flowrate of said forced flow of said precursor material according to said measured characteristic.

4. The method of claim 3, wherein said characteristic of step C1) is an emission and absorption spectra of said deposit interface and said precursor material, which determines a reaction rate and a temperature distribution at said deposit interface.

5. A method of growing a prescribed solid structure, comprising steps of:
   A) directing an impinging forced flow of pressurized precursor material onto a deposit interface, said impinging forced flow being of smaller cross-section than an instantaneous cross-section of said solid structure being grown, wherein species in said impinging forced flow of said pressurized precursor material adsorb onto said deposit interface;
   B) inducing a localized pyrolytic reaction of said adsorbed species by heating said deposit interface to a prescribed temperature distribution, wherein said pyrolytic reaction results in a localized growth of said deposit interface;
   C) measuring radiative emissions from said localized pyrolytic reaction, wherein said radiative emissions are a measure of an instantaneous growth rate of said deposit interface;
   D) controlling a growth direction, an instantaneous cross-section, and said instantaneous growth rate of said deposit interface with said temperature distribution and a flow direction and a flowrate of said impinging forced flow that varies said instantaneous cross-section and said growth direction;
   E) compensating for deviations from said prescribed solid structure by automatically adjusting in real-time said temperature distribution and said flow direction and said flowrate of said impinging forced flow, according to said measured radiative emissions; and
   F) forming said prescribed solid structure of said varied instantaneous cross-section and said varied growth direction through said controlled growth of said deposit.

6. The method of claim 1, wherein said directing step further comprises a step of: flowing a powder material with said forced flow of said precursor material to form a single flow.

7. The method of claim 5, wherein said directing step further comprises the step of: directing a powder flow of a powder material separately from said flow of said precursor material, wherein said powder flow of said powder material and said flow of said precursor material meet at said deposit interface.

8. The method of claim 6, further comprising steps of: directly controlling said localized growth of said deposit by selectively
   A) varying said temperature distribution at said deposit interface; and
   B) varying a concentration of said precursor material and a powder concentration of said powder material at said deposit interface.

9. The method of claim 8, further comprising steps of: varying said temperature distribution by selectively
   A) directing radiative energy beams at said deposit interface;
   B) heating through conduction from thermal energy sources;
   C) transferring thermal energy from ambient fluids surrounding said deposit interface; or
   D) converting mechanical work into heat at a region of said temperature distribution.

10. The method of claim 8, further comprising steps of: varying said concentration of precursor material through use of diluent flows which dilute the concentration of precursor material and a powder concentration at regions outside a growth zone.

11. The method of claim 8, further comprising a step of: controlling an orientation and position of said temperature distribution and said concentration of precursor material and a powder concentration with respect to the deposit interface with fully-arbitrary degrees of freedom.

12. The method of claim 5, further comprising a step of: simultaneously using a multiplicity of said precursor material in proportional concentrations, to produce deposits composed of at least one constituent element.

13. The method of claim 5, further comprising a step of: applying an external electric or magnetic field at said deposit interface during said growth of said deposit interface, wherein said magnetic field influences said direction of said growth.

14. The method of claim 5, further comprising measuring a shape of said solid structure and compensating for said deviations from said prescribed solid structure by automatically adjusting in real-time said temperature distribution and said flow direction and said flowrate of said impinging flow according to said measured shape.

15. The method of claim 5, further comprising a nondestructive measuring of an internal crystal structure of said deposit interface during said growth and compensating for said deviations from said prescribed solid structure by automatically adjusting in real-time said temperature distribution and said flow direction and said flowrate of said impinging flow according to said measured internal crystal structure.

16. The method of claim 5, further comprising measuring a composition of said deposit interface during said growth and compensating for said deviations from said prescribed solid structure by automatically adjusting in real-time said temperature distribution and said flow direction and said flowrate of said impinging flow according to said composition.

17. The method of claim 9, further comprising a step of: using multiple said-radiative energy beams to produce at least one region of said temperature distribution on said deposit interface.

18. The method of claim 8, further comprising a step of: using multiple said forced flow of said precursor material to produce a plurality of regions of said concentration of precursor material.

19. The method of claim 12, further comprising a step of: creating a second structure composed of a multiplicity of solid structures, wherein said at least one constituent element of said solid structures is selectively chemically etched, removing all or part of at least one of said solid structures.

20. The method of claim 5, wherein said precursor material is impinged on said deposit interface at pressures greater than one bar.

21. The method of claim 20, wherein said impinging forced flow is encapsulated within a co-axial flow of inert fluids.

22. A method of growing a solid structure, comprising steps of:
   A) directing an impinging forced flow of pressurized precursor material and powder material onto a deposit interface, wherein said powder material and said precursor material are combined into a single flow, said single flow being of smaller cross-section than an instantaneous cross-section of said solid structure, wherein species in said pressurized precursor material in said single flow adsorb onto said deposit interface and said powder material;
   B) inducing a localized pyrolytic reaction of said adsorbed species by heating said deposit interface and said powder material to a prescribed temperature distribution, wherein said pyrolytic reaction results in a localized growth of said deposit interface and incorporation of said powder material into said deposit interface;

C) controlling a growth direction, an instantaneous cross-section, and a rate of said growth of said deposit interface with said temperature distribution and a flow direction and flowrate of said single flow that varies said instantaneous cross-section and said growth direction; and D) forming a jointless, solid structure of said varied instantaneous cross-section and said varied growth direction through said controlled growth of said deposit by said single flow.

23. A method of growing a structure, comprising steps of:

A) directing a forced flow of precursor material and a powder material onto a deposit interface;

B) inducing a localized pyrolytic reaction of said precursor material with a temperature, wherein said localized pyrolytic reaction results in a growth of said deposit interface;

C) controlling a growth direction and a cross-section of said growth of said deposit interface with said temperature and a flow direction and a flowrate of said forced flow that varies said cross-section and said growth direction;

D) directly controlling said growth of said deposit interface by selectively varying an amount of concentration of said precursor material and an amount of powder concentration of said powder material at said deposit interface; and E) forming a jointless, solid structure of said varied cross-section and said varied growth direction through said controlled growth of said deposit interface.

24. A method of growing a structure, comprising steps of:

A) directing a forced flow of a powder material and of a precursor material onto a deposit interface, wherein said powder material and said precursor material are combined into a single flow, said single flow being generated by decomposition of said precursor material;

B) inducing a localized pyrolytic reaction of said decomposed precursor material with a temperature, wherein said localized pyrolytic reaction results in a growth of said deposit interface;

C) controlling a growth direction, and a cross-section of said growth of said deposit interface with said temperature and a flow direction and a flowrate of said single flow that varies said cross-section and said growth direction; and D) forming a jointless, solid structure of said varied cross-section and said varied growth direction through said controlled growth of said deposit interface.

25. The method of claim 24, further comprising steps of: directly controlling said growth of said deposit interface by selectively A) varying said temperature at said deposit interface; and B) varying an amount of concentration in said single flow to be deposited at said deposit interface.

* * * * *